(12) United States Patent
Zhong (10) Patent No.: US 11,706,889 B1
(45) Date of Patent: Jul. 18, 2023

(54) LATCH ASSEMBLY AND ELECTRONIC DEVICE USING SAME

(71) Applicant: Wistron Corporation, New Taipei (TW)

(72) Inventor: Yong-Qing Zhong, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/678,051

(22) Filed: Feb. 23, 2022

(30) Foreign Application Priority Data

Dec. 31, 2021 (CN) .......................... 202111674039.8

(51) Int. Cl.
*H05K 7/14* (2006.01)
*H05K 7/20* (2006.01)

(52) U.S. Cl.
CPC ....... *H05K 7/1401* (2013.01); *H05K 7/20172* (2013.01)

(58) Field of Classification Search
CPC .......................... H05K 7/1401; H05K 7/20172
See application file for complete search history.

(56) References Cited

U.S. PATENT DOCUMENTS 9,723,751 B2 * 8/2017 Doglio ..................... F16F 15/02

FOREIGN PATENT DOCUMENTS

CN 102684002 9/2012
TW I678139 11/2019

OTHER PUBLICATIONS

"Office Action of Taiwan Counterpart Application", dated Jun. 27, 2022, p. 1-p. 8.

* cited by examiner

*Primary Examiner* — Anthony Q Edwards
*Assistant Examiner* — Hung Q Dang
(74) *Attorney, Agent, or Firm* — JCIPRNET (57) ABSTRACT

A latch assembly and an electronic device using the same are provided. The electronic device includes a chassis, a fan module, and the latch assembly. The chassis has a chassis sidewall and a fixing bolt fixed on the chassis sidewall. The fan module is adapted to be accommodated in the chassis. The latch assembly is mounted on a module sidewall of the fan module. The latch assembly includes a latch is pivotally connected to the module sidewall, a moving member movably disposed on the module sidewall and connected to the latch, and a rotating hook pivoted on the module sidewall and connected to the moving member. The rotating hook and the latch are respectively connected to opposite sides of the moving member. When the fan module is placed in the chassis, the rotating hook of the latch assembly is adapted to be hooked to the fixing bolt of the chassis.

20 Claims, 12 Drawing Sheets

LATCH ASSEMBLY AND ELECTRONIC DEVICE USING SAME

CROSS-REFERENCE TO RELATED APPLICATION

This application claims the priority benefit of Chinese application no. 202111674039.8, filed on Dec. 31, 2021. The entirety of the above-mentioned patent application is hereby incorporated by reference herein and made a part of this specification.

BACKGROUND

Technical Field

The disclosure relates to a latch assembly and an electronic device using the latch assembly.

Description of Related Art

In electronic devices such as a server, it is required to dissipate accumulated heat in a chassis utilizing a fan module. With increasing demands for heat dissipation, fans that need to be accommodated in the fan module are also increasing.

However, since the total weight of the fan module increases with the increasing number of fans used in the fan module, it is required to strength fastening between the fan module and the chassis of the electronic device.

In addition, the use of additional hand tools is often required for disassembly and assembly of the fan module and the chassis. If the disassembly and assembly can be performed without the use of hand tools, it may be more convenient for the personnel.

SUMMARY

The disclosure provides a latch assembly capable of relatively laborsaving disassembly and assembly of a first object and a second object without the use of hand tools.

The disclosure provides an electronic device using the above-mentioned latch assembly.

A latch assembly of the disclosure is adapted to be mounted on a first object to lock the first object on the second object. The second object has a fixing bolt, and the latch assembly includes a latch, a moving member, and a rotating hook. The latch is pivotally connected to a module sidewall of the first object. The moving member is assembled on the module sidewall and connected to the latch. The rotating hook is pivoted on the module sidewall and connected to the moving member. The rotating hook and the latch are respectively connected to opposite sides of the moving member. When the first object is placed in the second object, the rotating hook of the latch assembly is adapted to be hooked to the fixing bolt of the second object to lock the first object on the second object.

An electronic device of the disclosure uses the above-mentioned latch assembly. The above-mentioned first object is a fan module, and the above-mentioned second object is a chassis. The chassis has a chassis sidewall and a fixing bolt. The fixing bolt is fixed on the chassis sidewall. The fan module is adapted to be mounted in the chassis, and fan module has a module sidewall. The latch assembly is mounted on the module sidewall. The latch assembly includes a latch, a moving member, and a rotating hook. The latch is pivotally connected to the module sidewall of the fan module. The moving member is movably disposed on the module sidewall and connected to the latch. The rotating hook is pivoted on the module sidewall and connected to the moving member. The rotating hook and the latch are respectively connected to opposite sides of the moving member. When the fan module is placed in the chassis, the rotating hook of the latch assembly is adapted to be hooked to the fixing bolt of the chassis.

In an embodiment of the disclosure, the latch is provided with a holding portion and a rotating portion. The rotating portion is provided with a first guide rail. The chassis is further provided with a first pin assembled on the chassis sidewall. The first pin is adapted to cooperate with the first guide rail.

In an embodiment of the disclosure, the moving member is provided with a guide groove extending along a gravity direction. The first pin is correspondingly located in the guide groove. The first pin and the guide groove are adapted to guide each other.

In an embodiment of the disclosure, the latch is further provided with a first protrusion protruding from the rotating portion toward the moving member. The moving member is provided with a second guide rail. The first protrusion is located in the second guide rail.

In an embodiment of the disclosure, the second guide rail includes a main guide rail, a first branch, and a second branch. The first branch and the second branch extend in different directions from the main guide rail. The first branch and the second branch have an angular relationship. The first protrusion is adapted to move in the main guide rail, the first branch, or the second branch.

In an embodiment of the disclosure, the electronic device further includes a first elastic member. The first elastic member is connected between the moving member and the module sidewall. The moving member is adapted to be restored by an elastic force of the first elastic member.

In an embodiment of the disclosure, the moving member is further provided with a third guide rail. The rotating hook has a second protrusion. The second protrusion is located in the third guide rail.

In an embodiment of the disclosure, the electronic device further includes a stop assembled on the module sidewall. The stop is adapted to fix a position of the moving member.

In an embodiment of the disclosure, the electronic device further includes a second elastic member connected between the stop and the module sidewall. The stop is adapted to be restored by an elastic force of the second elastic member.

In an embodiment of the disclosure, a sidewall of the moving member is provided with a plurality of engaging slots. The engaging slots have different heights in a gravity direction. The stop is adapted to be in contact with one of the engaging slots to limit the position of the moving member in the gravity direction.

In an embodiment of the disclosure, the stop is provided with a guide inclined surface, and the chassis is provided with a second pin. The second pin is assembled on the chassis sidewall and disposed corresponding to the stop. When the fan module moves in the chassis in a gravity direction, the guide inclined surface and the second pin guide each other to move the stop away from the moving member.

In an embodiment of the disclosure, the module sidewall has a bent portion bent toward the chassis, and the chassis further includes a guide structure protruding toward the module sidewall. When the fan module is assembled on the chassis, the bent portion moves along the guide structure.

In an embodiment of the disclosure, the electronic device further includes a handle. The latch assembly is disposed as a pair of latch assemblies respectively mounted on a pair of module sidewalls of the fan module. The handle is connected between the pair of latch assemblies.

Based on the foregoing, in the latch assembly and the electronic device using the latch assembly of the disclosure, the first object (the fan module) and the second object (the chassis) can be locked together or unlocked for disassembly by a simple gesture of rotating the latch of the latch assembly. Accordingly, laborsaving disassembly and assembly can be achieved without the use of other hand tools.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
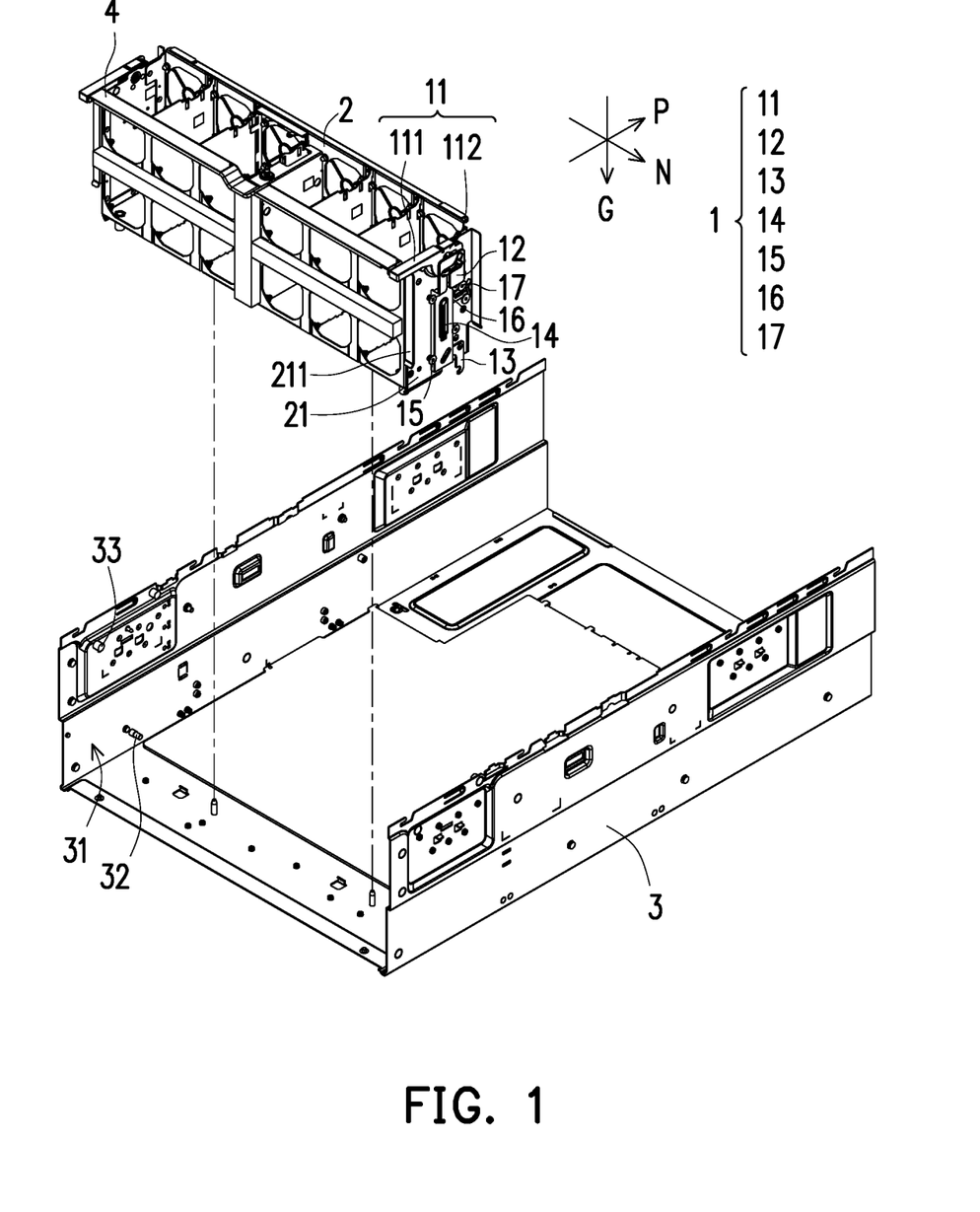
FIG. 1 is a schematic exploded diagram of an electronic device.
Figure 2A:
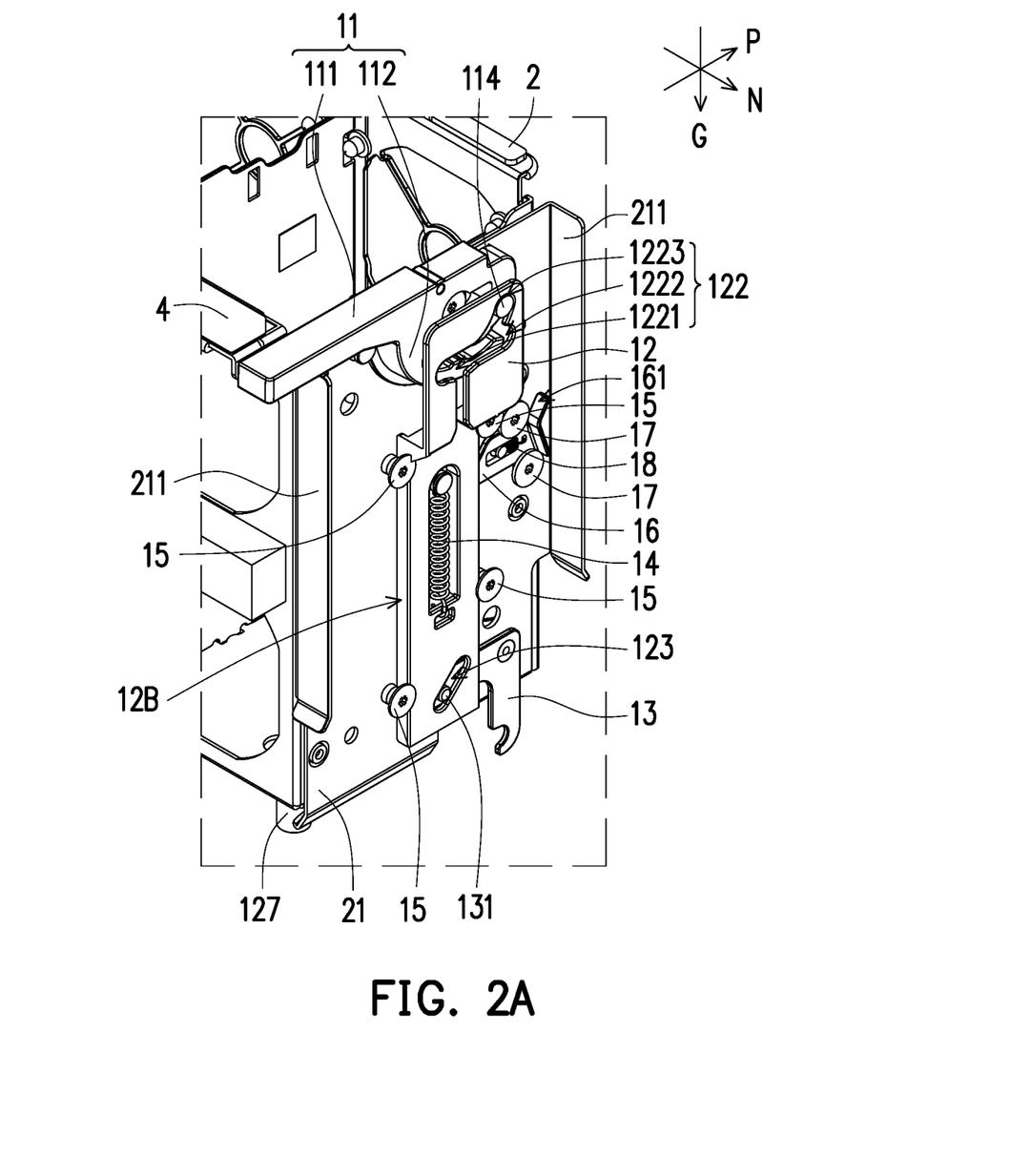
FIG. 2A is a schematic partial view of the electronic device in FIG. 1.
Figure 2B:
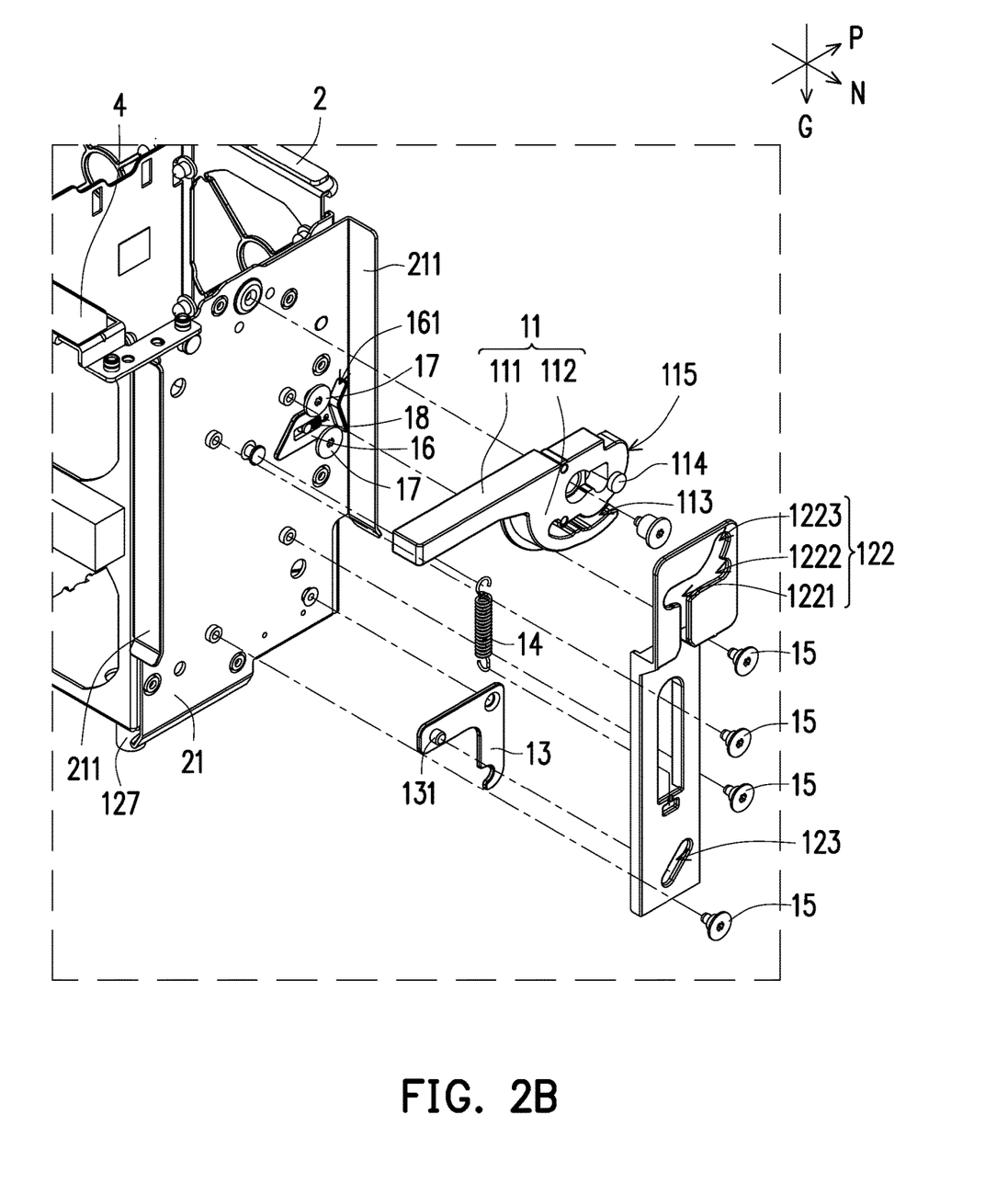
FIG. 2B is a schematic exploded view of FIG. 2A.
Figure 3:
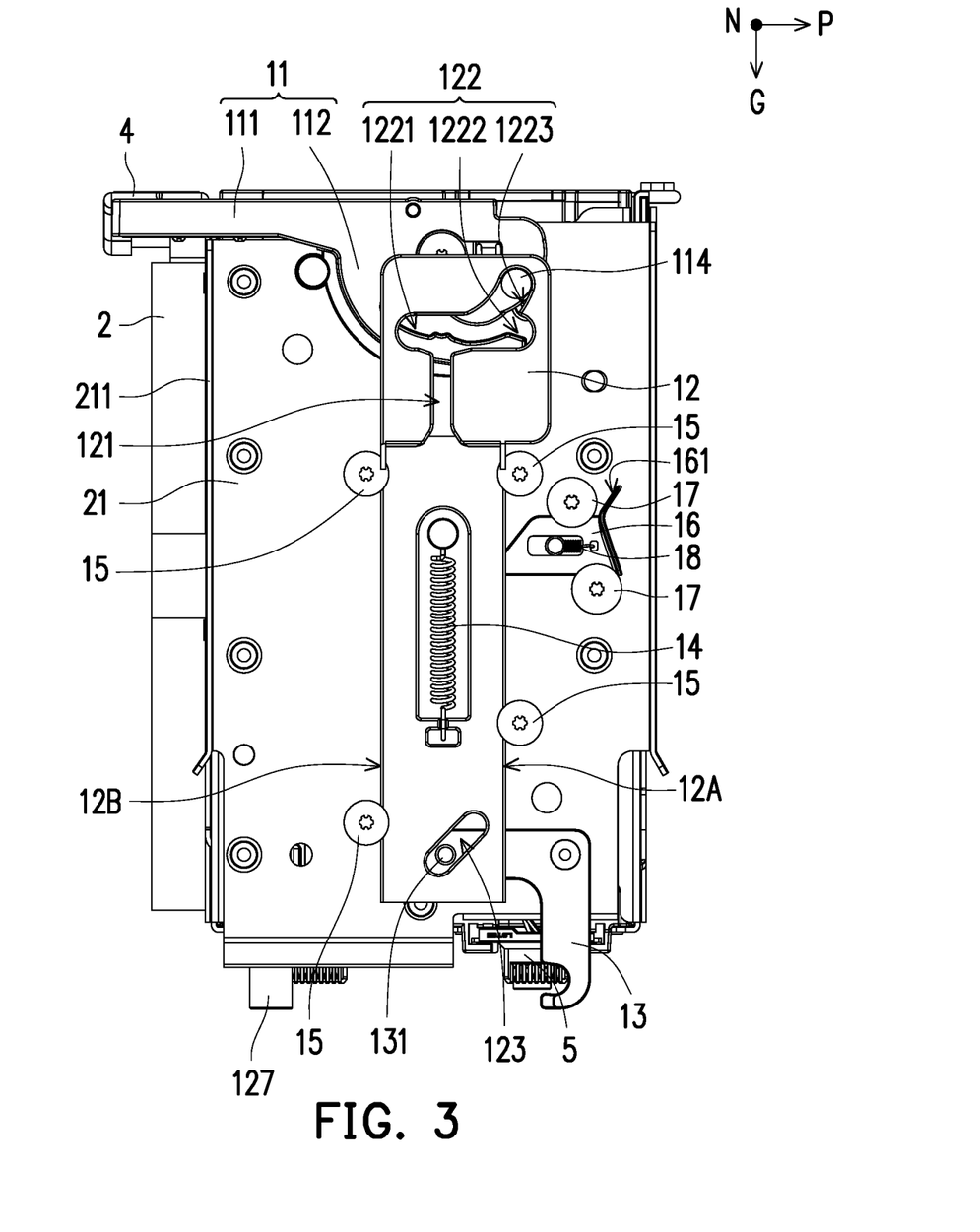
FIG. 3 is a schematic view of a side of the electronic device of FIG. 2A.

FIG. 1 is a schematic exploded diagram of an electronic device. FIG. 2A is a schematic partial view of the electronic device in FIG. 1. FIG. 2B is a schematic exploded view of FIG. 2A. FIG. 3 is a schematic view of a side of the electronic device of FIG. 2A. With reference to FIG. 1, FIG. 2A, and FIG. 3 together, a latch assembly 1 is adapted to be mounted on a first object, and to cooperate with the structure on a second object to lock the first object on the second object. Embodied in the electronic device of this embodiment, the first object is a fan module 2 and the second object is a chassis 3. The specific configuration of the electronic device will be described in detail below.

With continued reference to FIG. 1, FIG. 2A, and FIG. 3 together, the chassis 3 has a chassis sidewall 31 and a fixing bolt 32. The fixing bolt 32 is fixed on the chassis sidewall 31 and protrudes toward the inside of the chassis 3. The fan module 2 has a module sidewall 21. The latch assembly 1 is mounted on the module sidewall 21. The fan module 2 is configured to be accommodated in the chassis 3. A user may lock the fan module 2 into the chassis 3 by operating the latch assembly 1.

The latch assembly 1 includes a latch 11, a moving member 12, and a rotating hook 13. The latch 11 may be pivotally connected to the module sidewall 21 of the fan module 2 utilizing bolts or screws. Therefore, the latch 11 may rotate relative to the module sidewall 21 taking the bolt as the rotation axis. This way the latch 11 is pivotally connected to the module sidewall 21 is not limited to bolts or screws.

The moving member 12 is assembled on the module sidewall 21 and connected to the latch 11. The moving member 12 may be driven by the latch 11 to move relative to the module sidewall 21 along a gravity direction G or along an opposite direction of the gravity direction G.

In the gravity direction G, the rotating hook 13 and the latch 11 are located on opposite sides of the moving member 12. To be more specific, the latch 11 is adjacent to the top (not labeled) of the fan module 2, and the rotating hook 13 is adjacent to the bottom (not labeled) of the fan module 2. The rotating hook 13 may be pivoted on the module sidewall 21 utilizing bolts or screws, and the rotating hook 13 is connected to the moving member 12. Therefore, when driven by the moving member 12, the rotating hook 13 may rotate relative to the moving member 12 taking the bolt or screw as the center of rotation.

By the use of the latch assembly 1, after placing the fan module 2 in the chassis 3, the user may hold and rotate the latch 11 to rotate the latch 11 relative to the module sidewall 21. The latch 11 may link the moving member 12 to move the moving member 12 in the opposite direction of the gravity direction G. At this time, the rotating hook 13 is driven to rotate, so that the rotating hook 13 is hooked to the fixing bolt 32 on the chassis 3 to lock the fan module 2 to the chassis 3.

Figure 4:
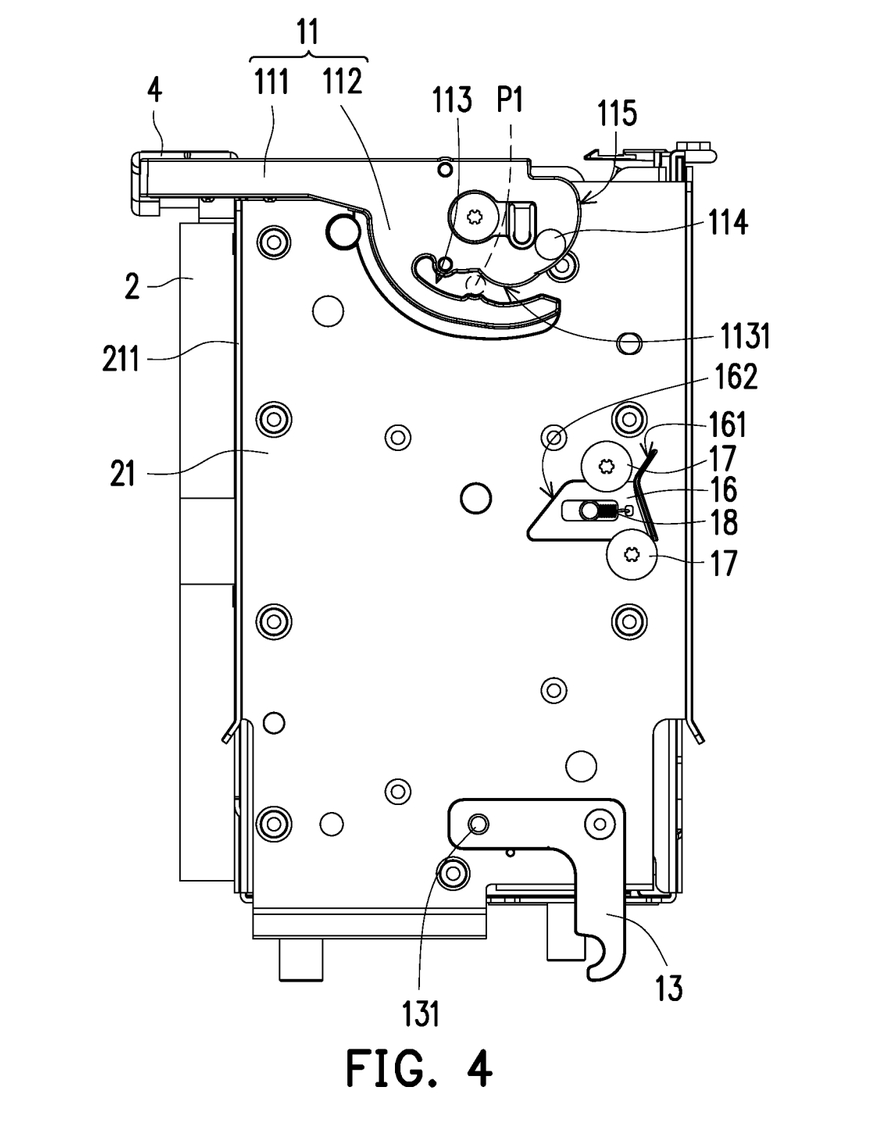
FIG. 4 is a schematic view of the module sidewall of the fan module of FIG. 2A.

FIG. 4 is a schematic view of the module sidewall of the fan module of FIG. 2A. For the sake of clarity, the moving member 12 is omitted in FIG. 4. With reference to FIG. 2A, FIG. 3, and FIG. 4 together, the latch 11 is provided with a holding portion 111 and a rotating portion 112. The rotating portion 112 is provided with a first guide rail 113. The chassis 3 is also provided with a first pin P1 protruding toward the fan module 2. When the fan module 2 is mounted inside the chassis 3 and the holding portion 111 is relatively close to the fan module 2, the first pin P1 is correspondingly located in the first guide rail 113.

In addition, the moving member 12 is provided with a guide groove 121 extending along the gravity direction G. The first pin P1 is also correspondingly located in the guide groove 121 (shown in FIG. 6), so that the first pin P1 and the guide groove 121 guide each other when the moving member 12 moves in the gravity direction G. In other words, according to the status of the latch 11, the first pin P1 may be located in the guide groove 121 of the moving member 12 and the first guide rail 113 of the rotating portion 112 at the same time.

With reference to FIG. 2B, FIG. 3, and FIG. 4 together, the latch 11 is also provided with a first protrusion 114. The moving member 12 is provided with a second guide rail 122. The first protrusion 114 is located in the second guide rail 122 and may move in the second guide rail 122.

Specifically, the second guide rail 122 includes a main guide rail 1221, a first branch 1222, and a second branch 1223. The first branch 1222 and the second branch 1223 extend into branches from the main guide rail 1221 toward the of the moving member 12. There exists a distance difference between the first branch 1222 and the second branch 1223 in the gravity direction G. To be more specific, the first branch 1222 and the second branch 1223 have an angular relationship. The first branch 1222 extend along a horizontal direction P, and the second branch 1223 extend toward the top (not labeled) of the fan module 2. As the latch 11 rotates relative to the fan module 2, the position of the first protrusion 114 in the second guide rail 122 can be switched, so that the first protrusion 114 is located in the first branch 1222 or the second branch 1223.

The electronic device also includes a first elastic member 14 connected between the moving member 12 and the module sidewall 21. The moving member 12 is restored along the gravity direction G by an elastic force of the first elastic member 14. The first elastic member 14 may be a spring.

The moving member 12 is also provided with a third guide rail 123. The rotating hook 13 has a second protrusion 131. The second protrusion 131 is located in the third guide rail 123. In this embodiment, the third guide rail 123 has an angular relationship with the horizontal direction P and the gravity direction G. An inclination angle of the third guide rail 123 may be changed according to requirements.

The electronic device also includes a plurality of first position limiting members 15 assembled on the module sidewall 21. The first position limiting members 15 are configured to limit the height of the moving member 12 in a normal direction N of the module sidewall 21. Specifically, the first position limiting members 15 are screws locked on the module sidewall 21 and arranged to form a track to limit the moving member 12 to moving back and forth only in the gravity direction G. In addition, the first position limiting members 15 also interfere with the moving member 12 to prevent the moving member 12 from moving in the normal direction N of the module sidewall 21 and/or in the horizontal direction P, where the horizontal direction P is perpendicular to both the gravity direction G and the normal direction N of the module sidewall 21.

The electronic device also includes a stop 16 assembled on the module sidewall 21. The stop 16 is adapted to move in the horizontal direction P to stop or release the moving member 12.

A plurality of second position limiting members 17 are assembled on the module sidewall 21 to limit the height of the stop 16 in the normal direction N of the module sidewall 21. In addition, the second position limiting members 17 are also configured to limit the stop 16 to moving back and forth only in the horizontal direction P, instead of moving in the normal direction N of the module sidewall 21 or moving in the gravity direction G.

In addition, a second elastic member 18 is connected between the stop 16 and the module sidewall 21, so that the stop 16 can be restored in an opposite direction of the horizontal direction P by an elastic force of the second elastic member 18. The second elastic member 18 may be a spring.

Figure 6:
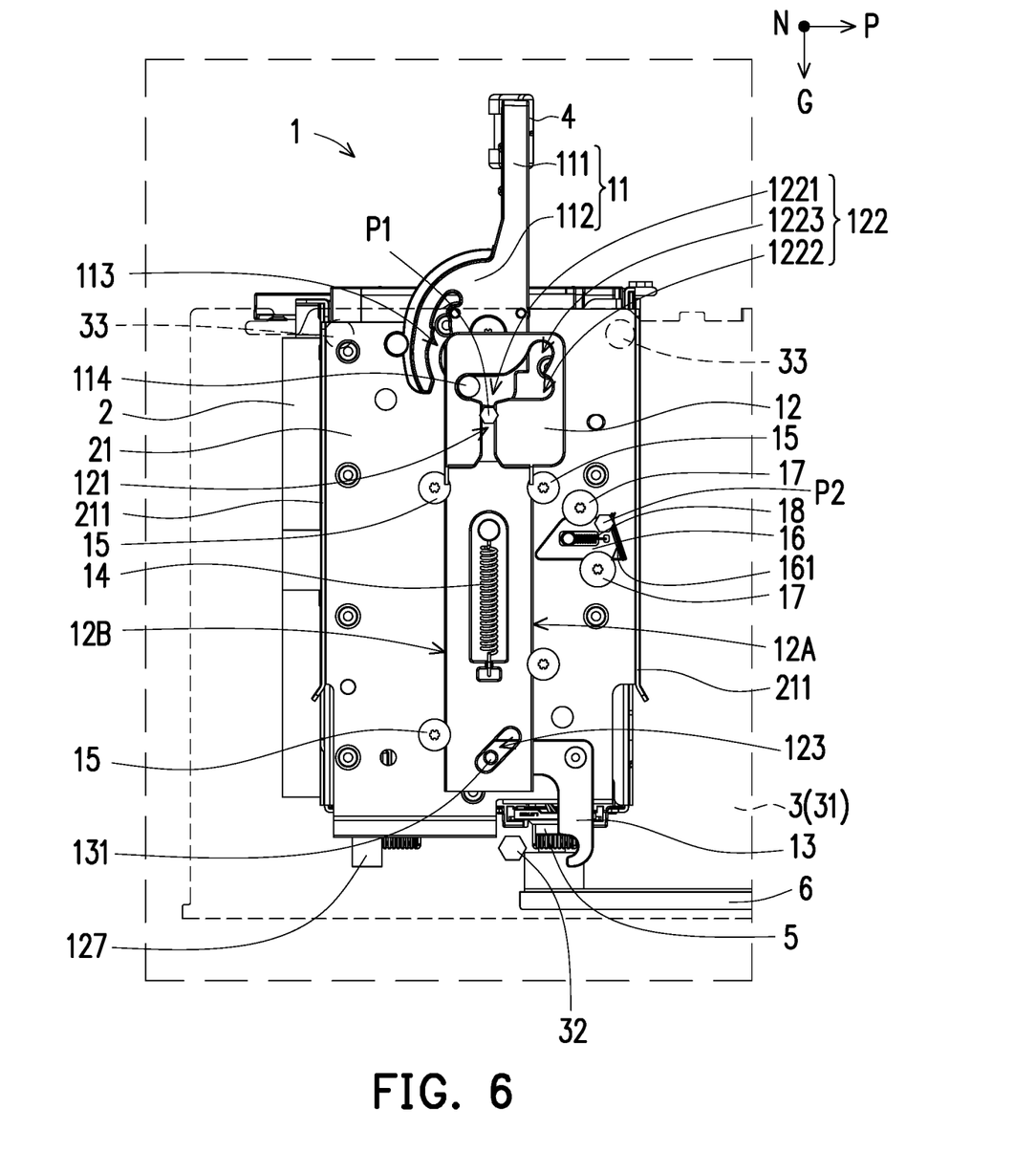
Figure 6A:
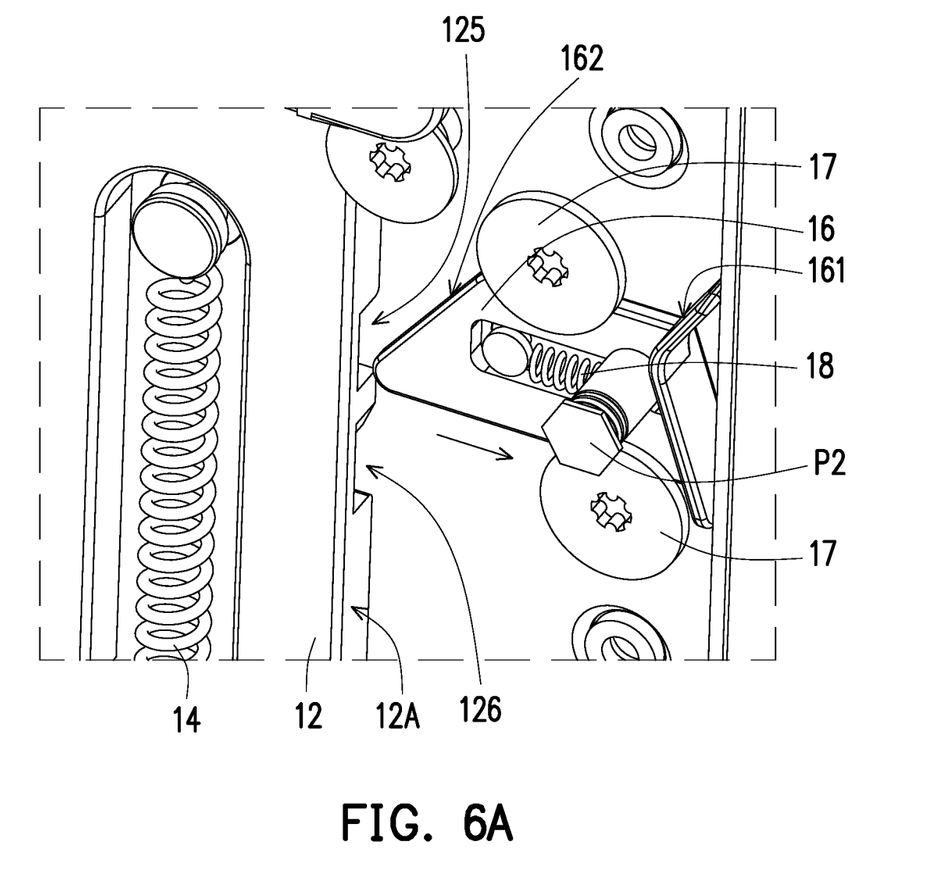
FIG. 6A is a schematic view of the second pin and the guide inclined surface interfering with each other to drive the stop out of the engaging slot.

It is worth mentioning that a sidewall 12A of the moving member 12 is provided with a plurality of engaging slots 125 and 126 (shown in FIG. 6A). The engaging slots 125 and 126 have different heights in the gravity direction G. To be more specific, the height of the engaging slot 126 in the gravity direction G is lower than the height of the engaging slot 125 in the gravity direction G. The stop 16 is configured to be in contact with one of the engaging slots 125 or 126 to limit a position of the moving member 12 in the gravity direction G.

Furthermore, the stop 16 is provided with a guide inclined surface 161. The chassis 3 is provided with a second pin P2 (shown in FIG. 6A). The second pin P2 is assembled on the chassis sidewall 31 and disposed corresponding to the stop 16. When the moving member 12 moves in the gravity direction G, the guide inclined surface 161 and the second pin P2 guide each other to drive the stop 16 to move in the horizontal direction P to unlock the moving member 12.

FIG. 5 to FIG. 8 illustrates flows of operating a latch for a latch assembly to lock a fan module on a chassis.

Figure 5:
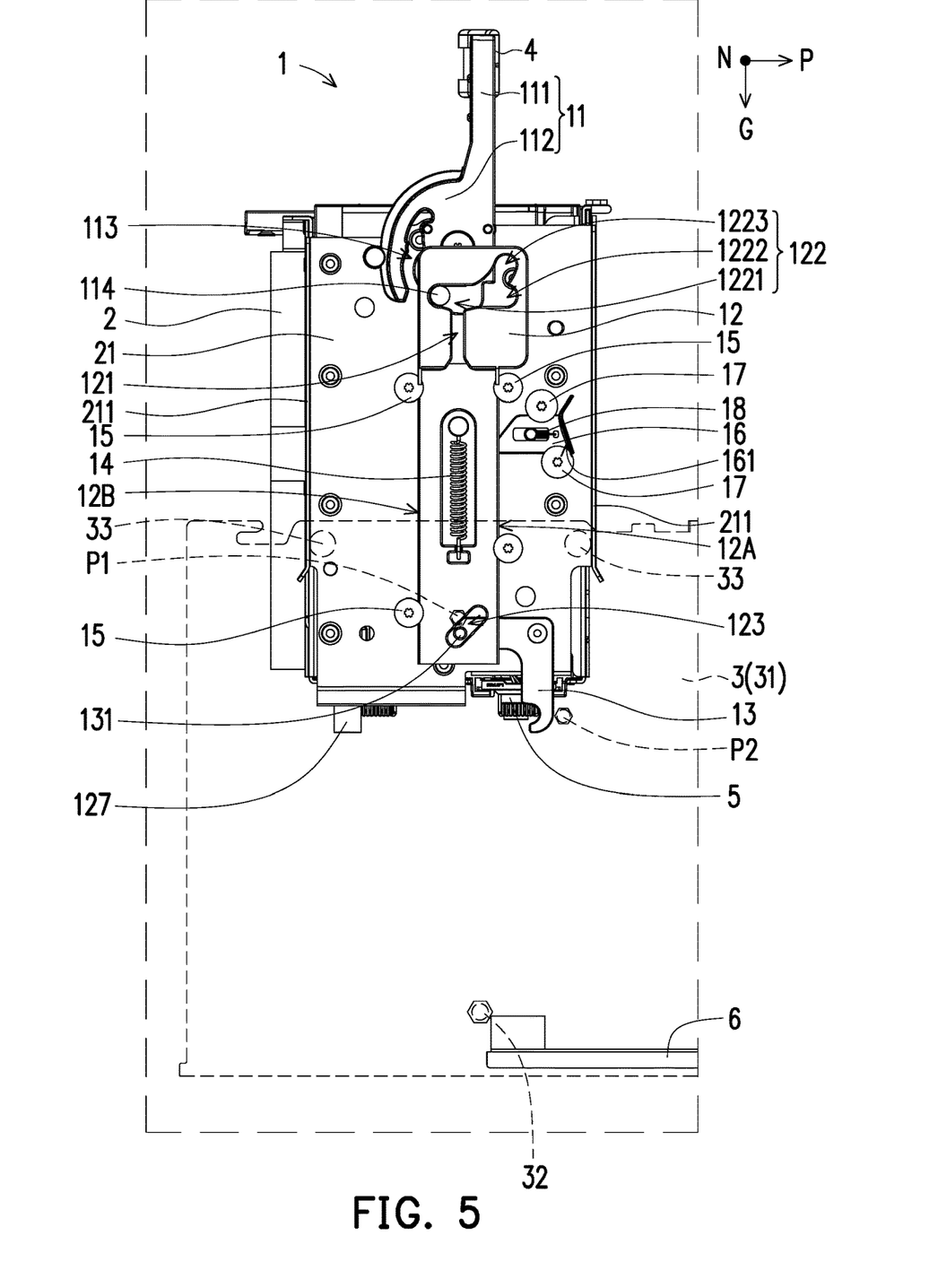
FIG. 5 to FIG. 8 illustrates flows of operating a latch for a latch assembly to lock a fan module on a chassis.

First, with reference to FIG. 5, the latch 11 is rotated from 0 degree to 90 degree to move the first protrusion 114 from an end of the second branch 1223 adjacent to the sidewall 12A of the moving member 12 to an end of the main guide rail 1221 adjacent to the other sidewall 12B of the moving member 12. Then, the fan module 2 is placed in the chassis 3.

Then, with reference to FIG. 5 and FIG. 6 together, by a bent portion 211 of the module sidewall 21 and a guide structure 33 inside the chassis 3 guiding each other, the fan module 2 is placed in the chassis 3 along the gravity direction G.

Figure 7:
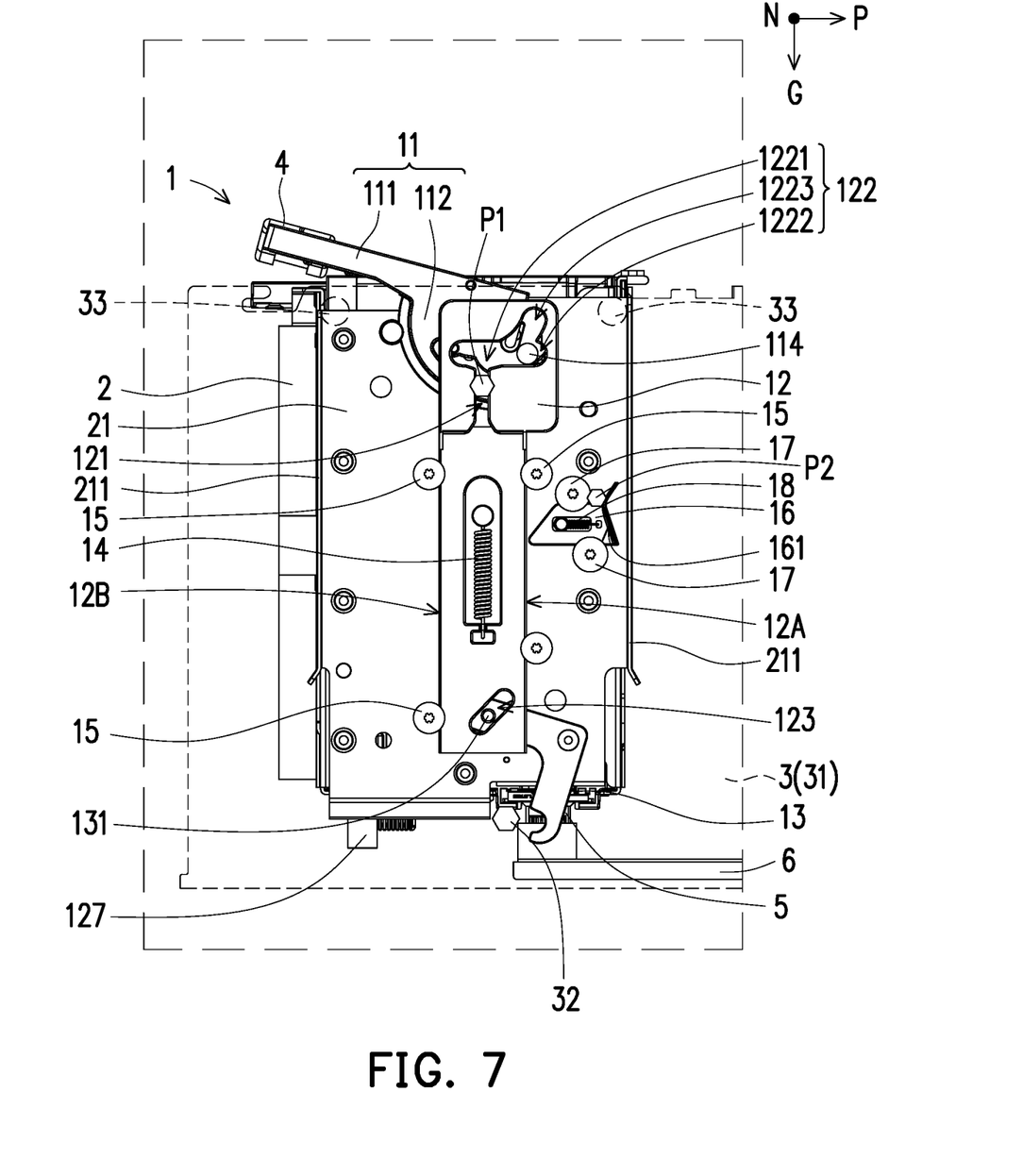
Figure 8:
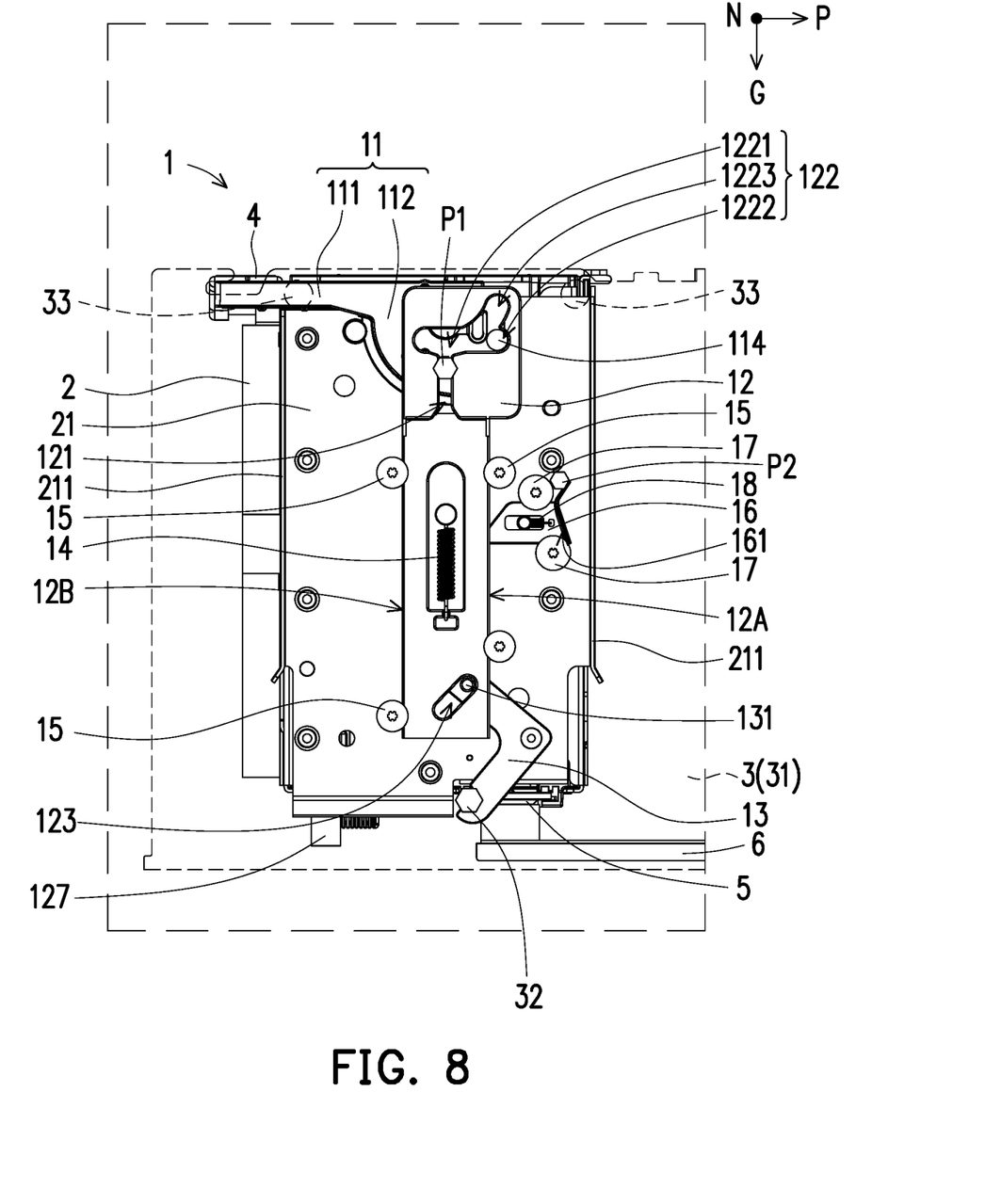

Then, with reference to FIG. 6, FIG. 7, and FIG. 8, the latch 11 is rotated from 90 degrees to 0 degrees. During this process, the first protrusion 114 moves in the second guide rail 122 from the main guide rail 1221 into the first branch 1222 and abuts against an end of the first branch 1222 adjacent to the sidewall 12A of the moving member 12. During the movement of the first protrusion 114, the first elastic member 14 provides an elastic restoration force to the moving member 12 to move the moving member 12 in the opposite direction of the gravity direction G.

In addition, as the latch 11 rotates, the first guide rail 113 of the latch 11 interferes with the first pin P1, and the first pin P1 enters and is located in the first guide rail 113. At this time, a lever is formed by the contact between the first pin P1 and the first guide rail 113, and the moving member 12 and the chassis sidewall 31 generate a relative linear motion to move the fan module 2 along the gravity direction G.

Moreover, since the second protrusion 131 is located in the third guide rail 123, along with the relative linear motion of the moving member 12 and the chassis sidewall 31, the rotating hook 13 is driven by the moving member 12 to rotate to be engaged with the fixing bolt 32. Accordingly, the fan module 2 is locked in the chassis 3.

Figure 8A:
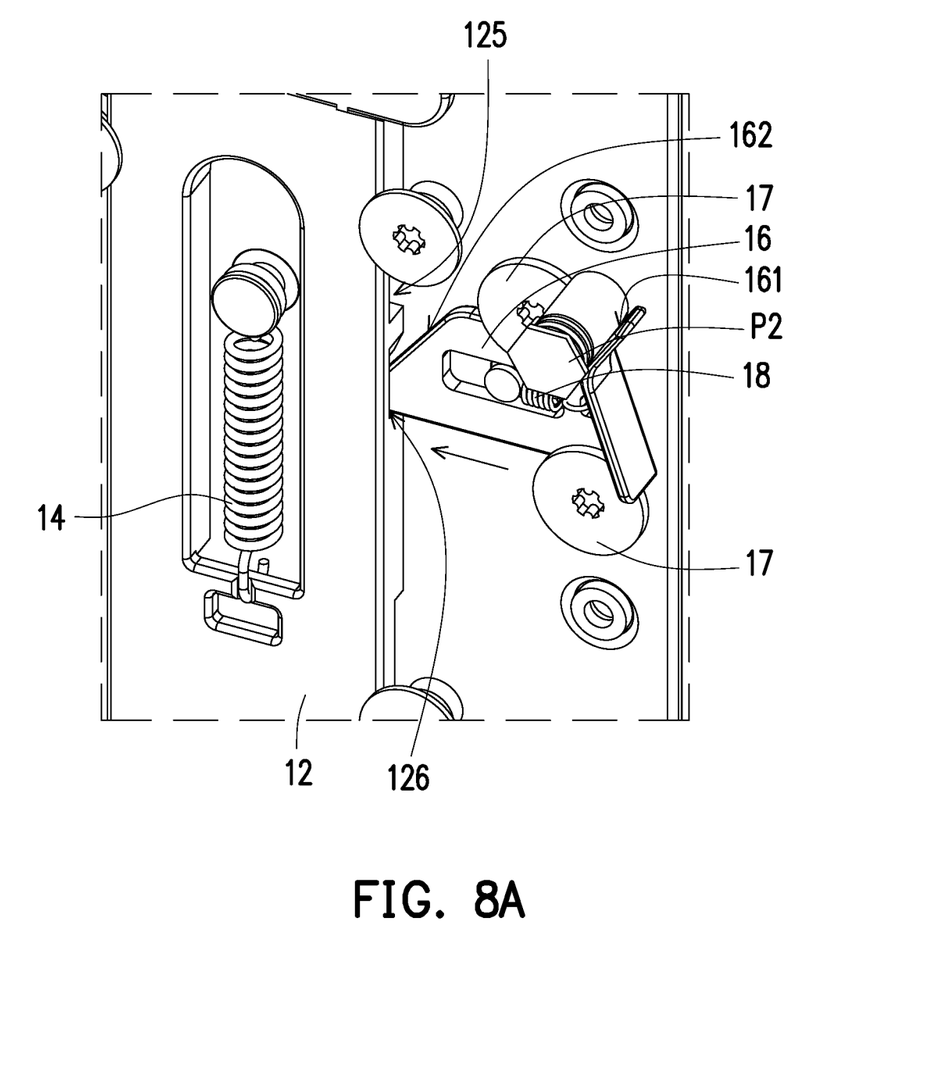
FIG. 8A is a schematic view of the stop engaged into another engaging slot.

FIG. 6A is a schematic view of the second pin and the guide inclined surface interfering with each other to drive the stop to be withdrawn from the engaging slot. FIG. 8A is a schematic view of the stop engaged into another engaging slot. With reference to FIG. 6A, FIG. 7, and FIG. 8A in sequence, during the process where the fan module 2 moves along the gravity direction G to be placed into the chassis 3, while the moving member 12 moves relative to the chassis sidewall 31 in the opposite direction of the gravity direction G, the second pin P2 disposed on the chassis sidewall 31 is in contact with the guide inclined surface 161 of the stop 16 from below the stop 16. In addition, the second pin P2 is guided and interfered with by the guide inclined surface 161, and drives the stop 16 to move along the horizontal direction P to withdraw the stop 16 from the engaging slot 125 of the moving member 12 and lift the position limitation on the moving member 12, so that the moving member 12 can be moved by the elastic restoration force of the first elastic member 14 in the opposite direction of the gravity direction G. At this time, the second elastic member 18 stores the elastic restoration force. When the fan module 2 continues to move relative to the chassis 3 in the gravity direction G to separate the second pin P2 from the guide inclined surface 161, the elastic restoration force of second elastic member 18 drives the stop 16 to move in the opposite direction of the horizontal direction P to be restored, and the moving member 12 continues to move in the opposite direction of the gravity direction G to engage the stop 16 into the another engaging slot 126 of the moving member 12 to limit the moving member 12 to moving in the gravity direction G.

When it is required to disassemble the fan module 2 from the chassis 3, with reference to FIG. 5 to FIG. 8A in an opposite sequence, the latch 11 is rotated from 0 degrees to 90 degrees again. A cam portion 115 (shown in FIG. 2B) of the latch 11 abuts against the moving member 12, and drives the moving member 12 to move along the gravity direction G. A second guide surface 162 of the stop 16 interferes with the engaging slot 126 to move the stop 16 away from the moving member 12. At this time, the first protrusion 114 moves from an end of the first branch 1222 adjacent to the sidewall 12A of the moving member 12 to an end of the main guide rail 1221 adjacent to the sidewall 12B of the moving member 12. In addition, as the moving member 12 moves, the rotating hook 13 starts to be separated from the fixing bolt 32. Moreover, through the leverage effect caused by the interference between an arc structure 1131 of the first guide rail 113 and the first pin P1, the fan module 2 moves relative to the chassis sidewall 31 in the opposite direction of the gravity direction G. At this time, the second pin P2 enters the guide inclined surface 161 of the stop 16 and moves the stop 16 along the horizontal direction P, and the rotating hook 13 is in a loose state. At this time, the fan module 2 may be taken out of the chassis 3 in the opposite direction of the gravity direction G. During the process of separating the fan module 2 from the chassis 3, the stop 16 starts to be restored and engaged into the moving slot 125 of the moving member 12 to fix the moving member 12 and the rotating hook 13, so that the fan module 12 may stand with a stand 127 and the rotating hook 13.

Figure 9:
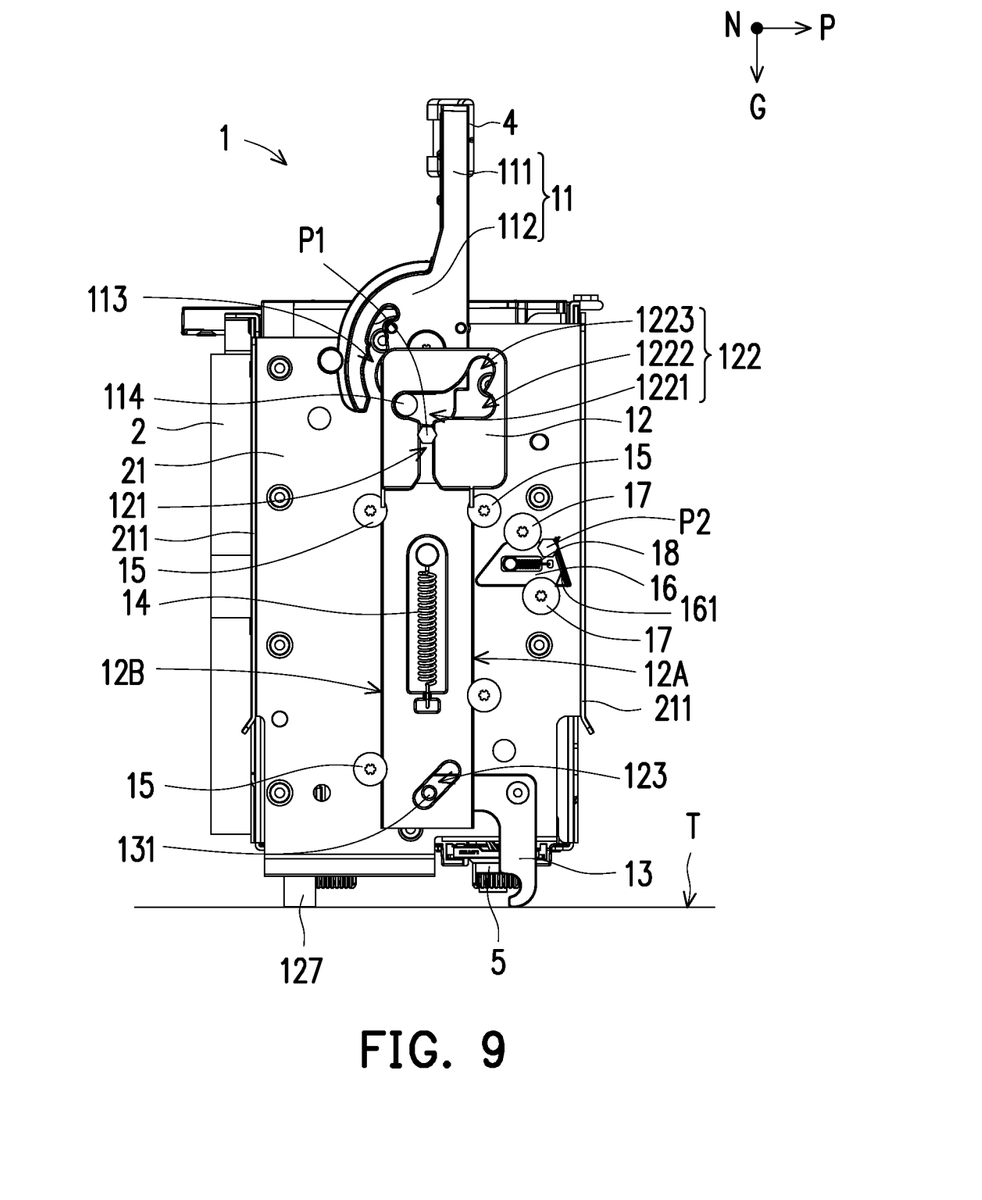
FIG. 9 is a schematic view of a fan module placed on a desktop.

FIG. 9 is a schematic view of a fan module placed on a desktop. With reference to FIG. 9, it is worth mentioning that the fan module 12 may stand on a desktop T with the stand 127 and the rotating hook 13 thereof. Therefore, when the fan module 12 is placed on the desktop T, a connector 5 mounted in the fan module 12 to be connected to a circuit board 6 (shown in FIG. 5 or FIG. 8) in the chassis 3 may not be in direct contact with the desktop T, which prevents the connector 5 from damage.

Then, with continued reference to FIG. 5 and FIG. 8, after the fan module 2 is completely separated from the chassis 3, when the latch 11 is to be closed, the latch 11 is rotated from 90 degrees back to 0 degrees. The first protrusion 114 enters the second branch 1223 from the main guide rail 1221 and abuts on an end of the second branch 1223 adjacent to the sidewall 12A of the moving member 12.

As shown from the above, the fan module 2 and the chassis 3 can be locked together or unlocked for disassembly by a simple gesture of rotating the latch 11 of the latch assembly 1, achieving convenient disassembly and assembly for the user.

In passing, the latch assembly 1 in this embodiment may be disposed as a pair of latch assemblies mounted on two opposite module sidewalls 21 of the fan module 2, and the pair of latch assemblies 1 may be connected using a handle 4. More specifically, the distal end of the holding portion 111 relatively away from the rotating portion 112 is locked on the handle 4. Accordingly, the latch 11 can be driven to operate more easily by lifting the handle 4.

In summary of the foregoing, in the latch assembly and the electronic device using the latch assembly of the disclosure, the first object (the fan module) and the second object (the chassis) can be locked together or unlocked for disassembly by a simple gesture of rotating the latch of the latch assembly, achieving convenient disassembly and assembly.

In addition, the assembly or disassembly of the first object and the second object does not require additional hand tools, such as screwdrivers.

Moreover, the rotation of the latch does not require a relatively great force, which achieves laborsaving disassembly and assembly.

Furthermore, the fan module may stand on the desktop with the stand and the rotating hook thereof. Therefore, when the fan module stands on the desktop, the connector mounted in the fan module is not in contact with the desktop, which prevents the connector from damage.

It will be apparent to those skilled in the art that various modifications and variations can be made to the disclosed embodiments without departing from the scope or spirit of the disclosure.

In view of the foregoing, it is intended that the disclosure covers modifications and variations provided that they fall within the scope of the following claims and their equivalents.

What is claimed is:

1. An electronic device, comprising:
   a chassis having a chassis sidewall and a fixing bolt, wherein the fixing bolt is fixed on the chassis sidewall;
   a fan module adapted to be accommodated in the chassis, wherein the fan module has a module sidewall; and
   a latch assembly mounted on the module sidewall, wherein the latch assembly comprises:
   a latch pivotally connected to the module sidewall of the fan module;
   a moving member movably disposed on the module sidewall and connected to the latch; and
   a rotating hook pivoted on the module sidewall and connected to the moving member, wherein the rotating hook and the latch are respectively connected to opposite sides of the moving member;
   wherein, when the fan module is placed in the chassis, the rotating hook of the latch assembly is adapted to be hooked to the fixing bolt of the chassis.

2. The electronic device according to claim 1, wherein the latch is provided with a holding portion and a rotating portion, the rotating portion is provided with a first guide rail, the chassis is further provided with a first pin assembled on the chassis sidewall, and the first pin is adapted to cooperate with the first guide rail.

3. The electronic device according to claim 2, wherein the moving member is provided with a guide groove extending along a gravity direction, the first pin is correspondingly located in the guide groove, and the first pin and the guide groove are adapted to guide each other.

4. The electronic device according to claim 2, wherein the latch is further provided with a first protrusion protruding from the rotating portion toward the moving member, the moving member is provided with a second guide rail, and the first protrusion is located in the second guide rail.

5. The electronic device according to claim 4, wherein the second guide rail comprises a main guide rail, a first branch, and a second branch, the first branch and the second branch extend in different directions from the main guide rail, the first branch and the second branch have an angular relationship, and the first protrusion is adapted to move in the main guide rail, the first branch, or the second branch.

6. The electronic device according to claim 1, further comprising a first elastic member, wherein the first elastic member is connected between the moving member and the module sidewall, and the moving member is adapted to be restored by an elastic force of the first elastic member.

7. The electronic device according to claim 1, wherein the moving member is further provided with a guide rail, the rotating hook has a protrusion, and the protrusion is located in the guide rail.

8. The electronic device according to claim 1, further comprising a stop assembled on the module sidewall and adapted to fix a position of the moving member.

9. The electronic device according to claim 8, further comprising a second elastic member, wherein the second elastic member is connected between the stop and the module sidewall, and the stop is adapted to be restored by an elastic force of the second elastic member.

10. The electronic device according to claim 8, wherein a sidewall of the moving member is provided with a plurality of engaging slots, the engaging slots have different heights in a gravity direction, and the stop is adapted to be in contact with one of the engaging slots to limit the position of the moving member in the gravity direction.

11. The electronic device according to claim 8, wherein the stop is provided with a guide inclined surface, the chassis is provided with a second pin, and the second pin is assembled on the chassis sidewall and disposed corresponding to the stop, wherein when the fan module moves in the chassis in a gravity direction, the guide inclined surface and the second pin guide each other to move the stop away from the moving member.

12. The electronic device according to claim 1, wherein the module sidewall has a bent portion bent toward the chassis, and the chassis further comprises a guide structure protruding toward the module sidewall, wherein when the fan module is assembled on the chassis, the bent portion moves along the guide structure.

13. The electronic device according to claim 1, further comprising a handle, wherein the latch assembly is disposed as a pair of latch assemblies respectively mounted on a pair of module sidewalls of the fan module, and the handle is connected between the pair of latch assemblies.

14. A latch assembly adapted to be mounted on a first object to lock the first object on a second object, wherein the second object has a fixing bolt, and the latch assembly comprises:
a latch pivotally connected to a module sidewall of the first object;
a moving member assembled on the module sidewall and connected to the latch; and
a rotating hook pivoted on the module sidewall and connected to the moving member, wherein the rotating hook and the latch are respectively connected to opposite sides of the moving member,
wherein, when the first object is placed in the second object, the rotating hook of the latch assembly is adapted to be hooked to the fixing bolt of the second object to lock the first object on the second object.

15. The latch assembly according to claim 14, wherein the latch is provided with a holding portion and a rotating portion, the rotating portion is provided with a first guide rail, the second object is further provided with a first pin protruding toward the first object, and the first pin is adapted to cooperate with the first guide rail.

16. The latch assembly according to claim 15, wherein the moving member is provided with a guide groove extending along a gravity direction, the first pin is correspondingly located in the guide groove, and the first pin and the guide groove are adapted to guide each other.

17. The latch assembly according to claim 15, wherein the latch is further provided with a first protrusion protruding from the rotating portion toward the moving member, the moving member is provided with a second guide rail, and the first protrusion is located in the second guide rail.

18. The latch assembly according to claim 17, wherein the second guide rail comprises a main guide rail, a first branch, and a second branch, the first branch and the second branch extend in different directions from the main guide rail, the first branch and the second branch have an angular relationship, and the first protrusion is adapted to move in the main guide rail, the first branch, or the second branch.

19. The latch assembly according to claim 14, further comprising a first elastic member, wherein the first elastic member is connected between the moving member and the module sidewall, and the moving member is adapted to be restored along a gravity direction by an elastic force of the first elastic member.

20. The latch assembly according to claim 14, wherein the moving member is further provided with a guide rail, the rotating hook has a protrusion, and the protrusion is located in the guide rail.

* * * * *